United States Patent [19]
Juskey et al.

[11] Patent Number: 5,177,669
[45] Date of Patent: Jan. 5, 1993

[54] MOLDED RING INTEGRATED CIRCUIT PACKAGE

[75] Inventors: Frank J. Juskey; Anthony B. Suppelsa, both of Coral Springs; Linda K. Berrian, Fort Lauderdale, all of Fla.

[73] Assignee: Motorola, Inc., Schaumburg, Ill.

[21] Appl. No.: 844,015

[22] Filed: Mar. 2, 1992

[51] Int. Cl.⁵ .............................................. H05H 7/20
[52] U.S. Cl. .................................. 257/675; 174/16.3; 361/388; 361/421; 361/386; 257/676; 257/681
[58] Field of Search .......................... 165/80.3, 185; 174/52.4, 52.3, 16.3; 361/383, 392, 394, 386-389, 421; 357/70, 74, 80-82

[56] References Cited

U.S. PATENT DOCUMENTS

| | | | |
|---|---|---|---|
| 4,195,193 | 3/1980 | Grabbe et al. | 361/421 |
| 4,303,934 | 1/1981 | Stitt | 174/52.4 |
| 5,012,386 | 4/1991 | McShane et al. | 361/386 |

Primary Examiner—Gregory D. Thompson
Attorney, Agent, or Firm—Dale W. Dorinski

[57] ABSTRACT

An integrated circuit package (10) is formed to reveal the active circuitry (15) on the die surface. An integrated circuit die (12) is mounted on a die mounting portion (32) of a metal lead frame (30) in such a manner that the die is supported on the lead frame by the perimeter portion of the die. The active circuitry (15) on the die is connected to the various metal frame leads (33) by wire bonds (18) between the bond pads on the die and the metal lead frame. Plastic molding material (50) is then molded to encapsulate the wire bond pads (17), the perimeter of the integrated circuit die (16), the wire bonds (18), a portion of the leads (33), the perimeter portion of the back of the die (22), and the lead frame die mounting portion (32). The plastic material is formed so as to expose the active circuitry on the face of the die and a central portion on the back of the die.

18 Claims, 5 Drawing Sheets

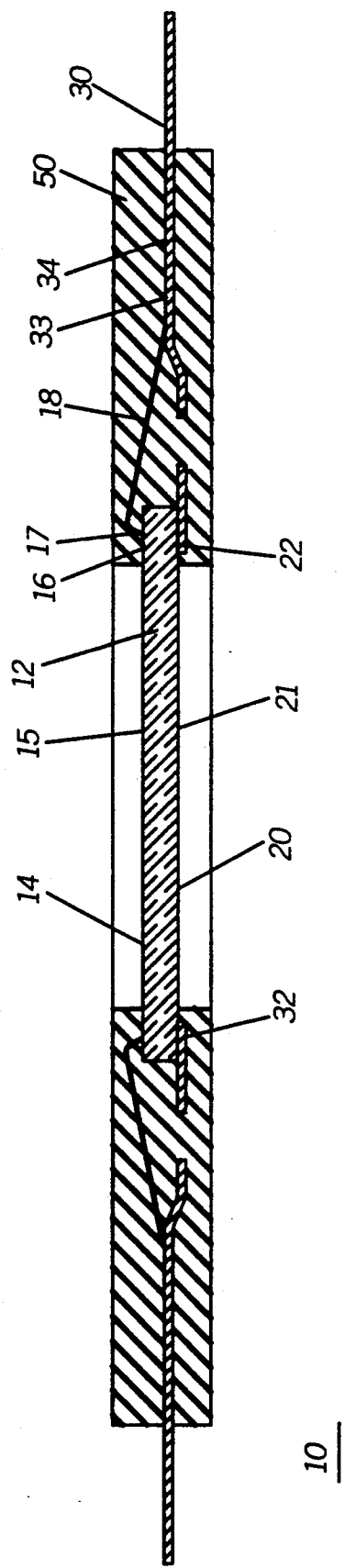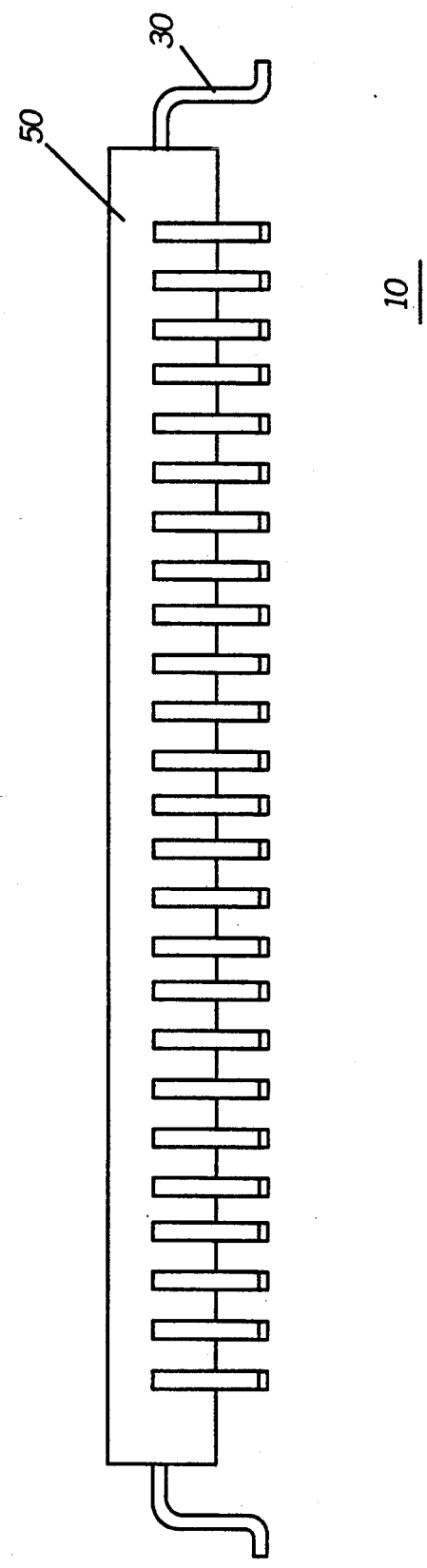

MOLDED RING INTEGRATED CIRCUIT PACKAGE

TECHNICAL FIELD

This invention relates generally to a package for an electronic device, and more particularly to a transfer molded integrated circuit package.

BACKGROUND

In the art of fabricating integrated circuits, it is well known that continuing goals are to make the circuit and the associated package smaller, more dense, more thermally efficient, and lower cost. A number of alternate packaging methodologies have been proposed to address these and other areas of concern. The module or casing in which the integrated circuit or IC is packaged is an important factor in the ultimate cost, performance, and lifetime of the integrated circuit. For example, as ICs become more dense, efficient dissipation of thermal energy generated by the chip becomes increasingly important in extending their useful life as far as possible. Another consideration is the increasing number of leads and connections to the integrated circuit pads, which correspondingly increases the complexity of the construction and adds to the cost of the end product. Increased density is also manifested by increases in size of the physical package. Because the size of the package is an exponential function of the number of leads emanating from the die, increasing density rapidly and dramatically increases the package size. Larger die and package sizes create increased thermal problems due to mismatch of the expansion coefficients of the packaging materials.

Transfer molding IC die in plastic packages such as dual in-line packages (DIP) or quad flat packs (QFP) creates significant problems when the DIP or QFP becomes large. Problems, such as heat management and expansion coefficient stresses, limit the upper size of the package. Numerous schemes have been proposed to address these problems, for example, adding appropriate fillers to the plastic molding compound to enhance thermal transfer. Fillers also reduce the expansion coefficient to more closely approximate that of the silicon IC. These methods have not been widely adopted by the industry since they do not totally address and appropriately solve all the problems.

Thus, a continuing goal in the art of providing packages for electronic components such as integrated circuits is a package design that addresses thermal management and thermal expansion coefficient mismatch problems satisfactorily in an arrangement that can be reliably manufactured at a low cost. Such a package has not previously been in existence for large integrated circuit packages.

SUMMARY OF THE INVENTION

Briefly, according to the invention, there is provided an integrated circuit package, formed to reveal the active circuitry on the die surface. An integrated circuit die is mounted on a die mounting portion of a metal lead frame in such a manner that the die is supported on the lead frame by a perimeter portion of the die. The active circuitry on the die is connected to the various lead frame leads by thin wires between bond pads on the die and the metal lead frame. A plastic material is then molded so as to encapsulate the wire bond pads, the perimeter of the integrated circuit die, the wire bonds, a portion of the leads, the perimeter portion of the back of the die, and the lead frame die mounting portion. The plastic material is formed so as to expose the active circuitry on the face of the die and a central portion on the back of the die.

In a further embodiment, the die mounting portion of the lead frame is shaped like a window frame, where the die rests on the window frame and the center of the die mounting portion is open to expose the back of the die.

BRIEF DESCRIPTION OF THE DRAWINGS

FIG. 1 is a cross-sectional view of an integrated circuit package in accordance with the invention, as viewed through section 1—1 of FIG. 2.

FIG. 5 is a side elevational view of an integrated circuit package in accordance with the invention.

DETAILED DESCRIPTION OF THE PREFERRED EMBODIMENT

Figure 3:
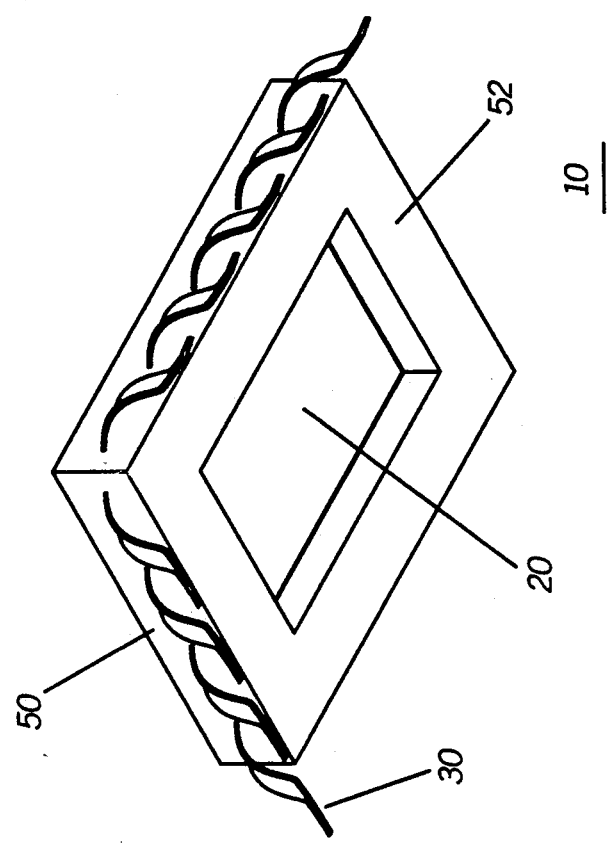
FIG. 3 is an isometric view of the bottom of an integrated circuit package in accordance with the invention.

The present invention will now be described in more detail with reference to various figures. The reader will find in FIG. 1 a cross-sectional view of the interior portions of the electronic package referenced as 10 and also seen in FIGS. 2 and 3 in an isometric view. In the center of the package 10 is an integrated circuit (IC) die 12 having a first face 14 and an opposed second face 20. The first face 14 has active circuitry 15 in a central area covering most of the first face. Surrounding the active circuitry 15 is a perimeter portion 16 which contains a plurality of wire bond pads 17. On the second face 20 of the die 12 is a central portion 21 and a perimeter portion 22 surrounding the central portion. The die 12 is mounted onto a lead frame 30 by positioning the die such that the perimeter portion 22 is resting upon a die mounting portion 32 of the lead frame. The die mounting portion 32 of the lead frame is preferentially configured in a window-frame type shape; that is, the window frame comprises a border with an aperture in the center whereupon the die 12 is mounted on the border of the window frame. This configuration allows the second face 20 of the die 12 to be exposed and not covered by a solid die-mounting paddle as in the conventional art. The die 12 is affixed to the die mounting portion 32 by any one of a number of conventional means such as eutectic die bonding, various alloys of solder, or by using a conductive epoxy. The adhesive material, such as the epoxy or eutectic bond, is applied between the perimeter portion 22 and the die mounting portion 32. In the preferred embodiment, a conductive epoxy is used and the epoxy is cured after mounting the die.

The die 12 is then electrically interconnected to the lead frame 30 by means of, for example, wire bonds 18. The lead frame 30 consists of the previously described die-mounting portion 32 and a plurality of leads having first portion 33 and a second portion 34. The leads surround the die mounting portion 32 in a fan-out type of pattern similar to that found in conventional lead frames for DIPs and QFPs. Wire bonds 18 are formed in conventional manner between the wire bond pads 17 and first portions 33 of the lead frame 30. The die 12 may also be flip-chip bonded to the lead frame 30 or TAB bonded to effect a similar type configuration. In such a case, the aforementioned first face and second face are now reversed because the active circuitry is mounted face down as opposed to face up, and the window frame attachment to the back of the die is not applicable.

Figure 4:
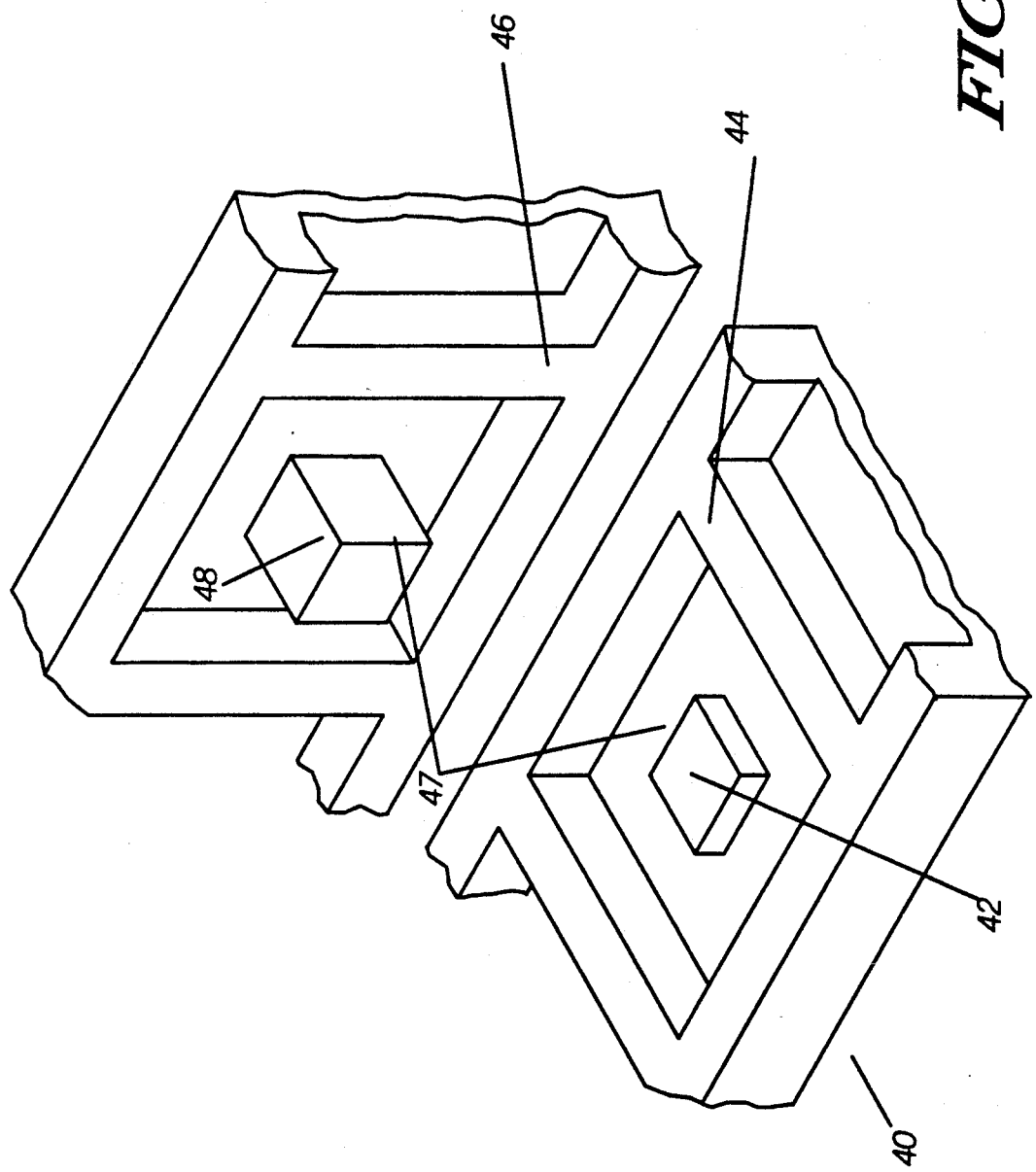
FIG. 4 is an isometric view of one embodiment of a mold for fabricating the integrated circuit package in accordance with the invention.

After the die 12 has been mechanically mounted to the die mounting portion 32 and electrically connected by wirebonds 18 to a first portion 33 of the lead frame 30, the assembly is then placed in a molding cavity in order to encapsulate the interconnect portion of the die, the wirebonds and the lead frame. Referring now to FIG. 4, a bottom half 40 of a mold has a pedestal or first member 42 upon which the die 12 rests. The lead frame 30 likewise rests upon a perimeter portion 44 of the mold. The upper half 46 of the mold corresponds to the bottom half 40 and has a pedestal or second member 48 which comes to rest upon the active circuitry 15 of the die 12. In the preferred embodiment, the second member 48 consists of an elastomeric material. The second member 48 protrudes beyond the plane of the surface of the upper half 46 so that when the upper half is placed on the bottom half 40 and the mold is closed, the elastomeric second member 48 bears upon the active surface 15 of the die and is compressed to form a tight seal. A plastic material, such as a transfer molding compound, is then injected or poured into the space 47 in the mold in order to encapsulate portions of the IC. During the molding operation, the elastomeric member 48 presses or bears against the active surface 15 of the die in order to prevent flashing of the molding compound across the die surface. The first member 42 in the bottom half of the mold may also be an elastomeric material so as to create a tight seal and more compliance around the die 12. Numerous elastomers may be used for this purpose, however, in a transfer-molding process, the elastomer must be a high-temperature material. A copolymer material made of a blend of styrene-butadiene rubber/styrene-based thermoplastic elastomer/silicone rubber has been found to be especially suitable for use in transfer molding operations. A suitable styrene-based thermoplastic elastomer is KRATON ® from Shell Chemical. Other elastomers suitable for high temperature use, such as silicone rubbers, may be substituted for the above mentioned copolymer blend. The plastic material may be applied by means other than by transfer molding. For example, by casting, injection molding, reaction injection molding, or using other thermoset materials.

Referring back to FIG. 1, it can be seen that the wirebonds 18, the wirebonds pads 17, the perimeter portion 16 of the top surface of the die, the first portion 33 of the lead frame, the die mounting portion 32, and the perimeter portion 22 of the bottom surface of the die have all been encapsulated or completely encased in the plastic molding material 50. The arrangement of the mold further provides that the second face 20 and the first face 14 of the die are both free of plastic molding material 50 and are revealed or exposed to the environment. The plastic molding material 50 now forms a ring (or square or rectangle) around the perimeter of the die and encases only interconnect portion of the die, the wirebonds and the lead frame, in contrast to conventional art where the entire die is encapsulated by the molding material. The instant invention eliminates the molding material from the surface of the active circuitry of the die and the back side of the die, thereby reducing the amount of molding material used and also reducing the attendant cost of the package. Eliminating molding material from large expanses of the die reduces the stresses caused by the mismatch in expansion coefficient between the molding material and the silicon die.

Figure 6:
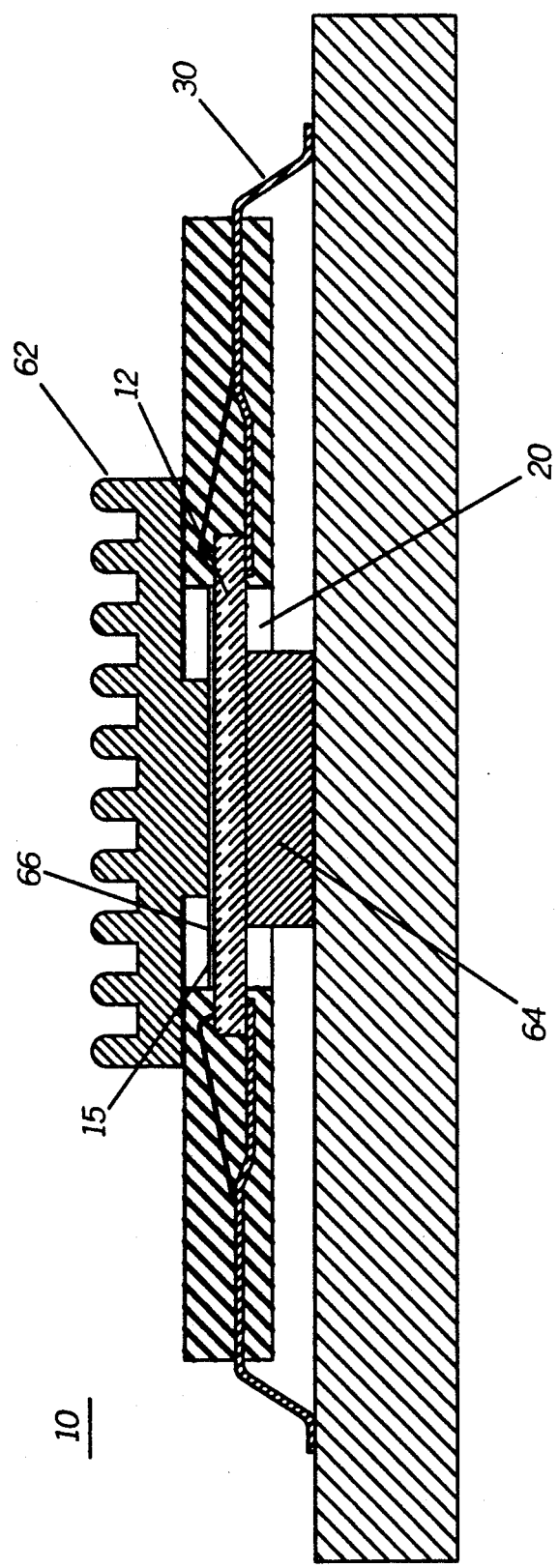
FIG. 6 is a cross-sectional view of an integrated circuit package having heat sinks in accordance with the invention.
Figure 7:
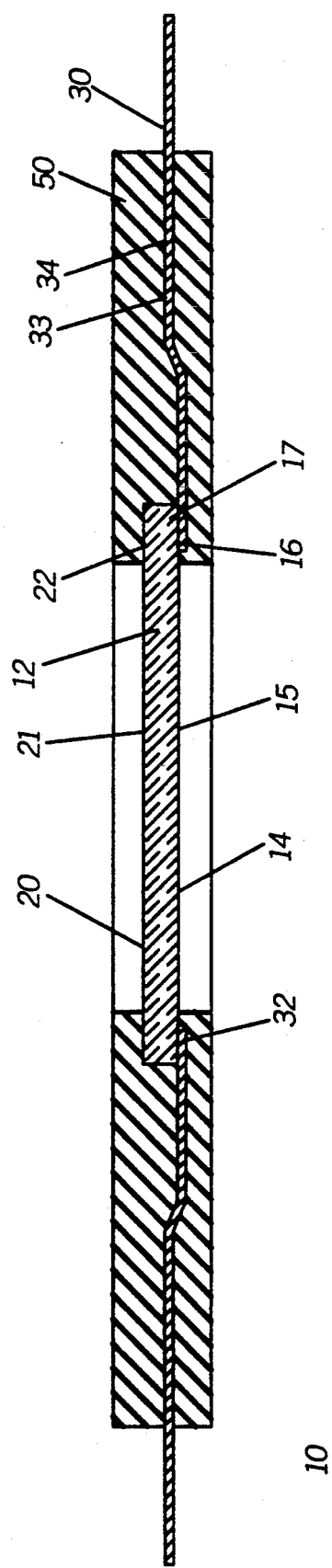
FIG. 7 is a cross-sectional view of an integrated circuit package in accordance with the invention as viewed through section 1—1 of FIG. 2.

With the back side of the die now open to the environment, heat may be more rapidly dissipated from the die by placing the package on a heat sink 64 such that the heat sink is in contact with the second face 20 of the die as shown in FIG. 6. Additionally, a second heat sink 62 may be placed on the top side 14 of the die. The active circuitry 15 on the surface of the die 12 is protected from environmental damage, corrosion, and other physical damage by a glass passivation layer 66 that is conventionally applied on the die during the semiconductor manufacturing process. A polymeric die coating, such as a silicone coating or gel, may also be applied over the active circuitry for protection. The second heat sink 62 may also be formed so as to serve as a cover for the electronic package 10, thereby further protecting the die 12 from physical damage. After the package has been molded, the ends of the lead frame 30 are bent or formed in the desired configuration so as to produce a configuration as shown in FIG. 5, a side view of the completed package. The lead frames 30 extend, preferentially, from all four sides of the electronic package 10. However, in a DIP configuration, they would only extend from two sides. The edges of the lead frame are shown bent in a gull wing type configuration, however, numerous configurations, such as J-lead, fold under, PLCC, straight lead, 90° bend to provide thru-hole mounting, etc., may be used without violating the spirit of the invention.

Figure 2:
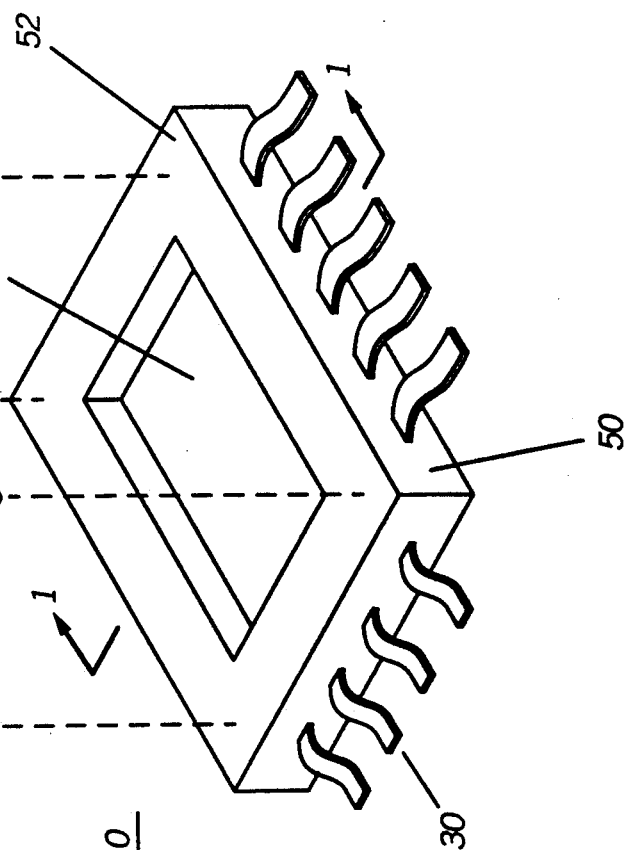
FIG. 2 is an isometric view of an integrated circuit package in accordance with the invention.

Referring now to FIGS. 2 and 3, isometric views of the package, it may be seen that the central portion or active circuitry area 15 of the die is open. This allows this active circuitry to be erased and reprogrammed, for example, by light if the die 12 is an EPROM. After erasing the memory of the die, a cover 60 may optionally be added, which rests upon the first face of the molded ring 52. The cover 60 protects the surface of the die 12 from further inadvertent programming by stray environmental light. The cover 60 may be a rigid cover that is adhesively bonded to the molded ring 52 or it may be any number of configurations that serve to provide the same function. For example, in the simplest configuration, the cover 60 is a small dot of film or paper with a pressure sensitive adhesive so as to allow easy removal and recovering of the die surface.

Many modifications may be made in the structure and process without departing from the scope of the claimed invention. For example, rather than use a metal lead frame, a circuit carrying substrate, such as ceramic, a printed circuit board, or a flexible film polymer, may be employed. If a flexible film polymer or other type of substrate is employed, it may have conductors on both sides and plated-thru holes to more effectively route the connections from the interior to the exterior of the package. An integrated circuit package has now been provided, which provides advantages of increased thermal dissipation, reduced cost, increased performance, and improved reliability by eliminating the stresses from the thermal mismatch between the encapsulating plastic and the integrated circuit die.

What is claimed is:

1. An integrated circuit package, comprising:
    a metal lead frame including a die mounting portion and a plurality of leads having first and second portions, said plurality of leads disposed around the die mounting portion;
    an integrated circuit die having two opposed faces, a first face including active circuitry in a central area and a plurality of wire bond pads disposed about a perimeter, and a second face including a central portion and a perimeter portion;
    said second face of said integrated circuit die being mounted on said die mounting portion, and said active circuitry being electrically attached to said first portion of said plurality of leads by thin wires extending between respective said wire bond pads and respective said lead first portion;
    plastic molding material formed over said wire bond pads, said integrated circuit die perimeter, said thin wires, said first portion of the plurality of leads, said perimeter portion of the second face, and said lead frame die mounting portion; and
    said plastic molding material formed so as to reveal said central area on said die first face and said central portion on said die second face.

2. The integrated circuit package as described in claim 1, wherein said die mounting portion of said lead frame comprises a window frame shape, wherein said window frame includes a portion substantially forming a border of lead frame material around a central aperture, said die perimeter second face resting upon said border.

3. The integrated circuit package as described in claim 1, wherein said die is passivated with a glass or polymer coating.

4. The integrated circuit package as described in claim 1, wherein said active circuitry comprises circuitry that may be erased when exposed to light.

5. The integrated circuit package as described in claim 1, wherein said plastic material is formed by transfer molding.

6. The integrated circuit package as described in claim 1, further comprising a heat sink attached to said second face of said die.

7. The integrated circuit package as described in claim 1, further comprising a heat sink mounted on said first face of said die.

8. The integrated circuit package as described in claim 1, further comprising a heat sink mounted on said first face of said die and a heat sink attached to said second face of said die.

9. The integrated circuit package as described in claim 1, further comprising a cover on said plastic molding material so as to provide physical protection to said revealed central area.

10. An integrated circuit package, comprising:
    a metal lead frame including a plurality of leads having first and second portions;
    an integrated circuit die having two opposed faces, a first face including active circuitry in a central area and a plurality of interconnect pads disposed about a perimeter, and a second face including a central portion and a perimeter portion;
    said active circuitry being electrically attached to said first portion of said plurality of leads by flip chip bonding between respective said interconnect pads and respective said lead first portion;
    plastic molding material formed over said interconnect pads, said integrated circuit die perimeter, said direct connections, said first portion of the plurality of leads, and said perimeter portion of the second face; and
    said plastic molding material formed so as to reveal said central area on said die first face and said central portion on said die second face.

11. The integrated circuit package as described in claim 10, wherein said die is TAB bonded to said lead frame.

12. The integrated circuit package as described in claim 10, wherein said active circuitry comprises circuitry that may be erased upon exposure to light.

13. The integrated circuit package as described in claim 10, further comprising a heat sink mounted on said first face of said die.

14. An integrated circuit package, comprising:
    a metal lead frame including a chip mounting portion having a window frame shape substantially forming a border of lead frame material around a central aperture, and a plurality of leads having first and second portions, said plurality of leads disposed in a pattern substantially around the chip mounting portion;
    an integrated circuit chip having two opposed faces, a first face including active circuitry in a central area and a plurality of wire bond pads disposed about a perimeter, and a second face including a central portion and a perimeter portion;
    said perimeter portion of said chip second face mounted upon said chip mounting window frame portion, and said active circuitry being electrically attached to said first portion of said plurality of leads by wire between respective said wire bond pads and respective said lead first portion;
    plastic material transfer molded over said wire bond pads, said chip perimeter, said wire bonds, said first portion of the plurality of leads, said perimeter portion of the second face, and said chip mounting portion;
    said plastic material formed so as to provide a first opening to reveal said central area on said chip first face and a second opening to reveal said central portion on said chip second face; and
    a cover over said first opening and attached to said plastic material to provide physical protection to said revealed active circuitry.

15. The integrated circuit package as described in claim 14, wherein said active circuitry comprises circuits that may be erased when exposed to light.

16. The integrated circuit package as described in claim 14, further comprising a heat sink attached to said second face of said die.

17. The integrated circuit package as described in claim 14, wherein said cover comprises a heat sink.

18. The integrated circuit package as described in claim 14, further comprising a heat sink mounted on said first face of said die and a heat sink attached to said second face of said die.

* * * * *

UNITED STATES PATENT AND TRADEMARK OFFICE
CERTIFICATE OF CORRECTION

PATENT NO. : 5,177,669
DATED : January 5, 1993
INVENTOR(S) : Juskey et al.

It is certified that error appears in the above-identified patent and that said Letters Patent is hereby corrected as shown below:

Column 6, line 39, after "wire" and before "between", insert --bonds--.

Signed and Sealed this

Seventh Day of June, 1994

Attest:

BRUCE LEHMAN

Attesting Officer        Commissioner of Patents and Trademarks